United States Patent
Yamauchi et al.

(10) Patent No.: US 8,766,924 B2
(45) Date of Patent: Jul. 1, 2014

(54) EL EMITTING TOUCH SWITCH

(75) Inventors: Kazuto Yamauchi, Okazaki (JP);
Yasunori Murayama, Ichinomiya (JP);
Sadahiko Tanaka, Okazaki (JP);
Keitaro Takizawa, Okazaki (JP);
Kouichi Yamanoue, Yokohama (JP)

(73) Assignees: Mitsubishi Jidosha Kogyo Kabushiki Kaisha, Tokyo (JP); Visteon Japan, Ltd., Kanagawa (JP)

( * ) Notice: Subject to any disclaimer, the term of this patent is extended or adjusted under 35 U.S.C. 154(b) by 1284 days.

(21) Appl. No.: 12/076,207

(22) Filed: Mar. 14, 2008

(65) Prior Publication Data
US 2009/0073133 A1  Mar. 19, 2009

(30) Foreign Application Priority Data
Sep. 19, 2007   (JP) .................................. 2007-242059

(51) Int. Cl.
*G06F 3/041*   (2006.01)

(52) U.S. Cl.
USPC ............. 345/173; 345/76; 345/104; 345/174; 345/179; 178/18.03

(58) Field of Classification Search
None
See application file for complete search history.

(56) References Cited

U.S. PATENT DOCUMENTS

| | | | | |
|---|---|---|---|---|
| 4,109,308 A | * | 8/1978 | Rodel | 363/125 |
| 4,740,781 A | * | 4/1988 | Brown | 345/174 |
| 6,239,788 B1 | * | 5/2001 | Nohno et al. | 345/173 |
| 2004/0100450 A1 | * | 5/2004 | Choi | 345/173 |
| 2004/0189621 A1 | * | 9/2004 | Cho et al. | 345/179 |
| 2004/0217945 A1 | * | 11/2004 | Miyamoto et al. | 345/173 |
| 2006/0017704 A1 | * | 1/2006 | Kim | 345/173 |

FOREIGN PATENT DOCUMENTS

| | | |
|---|---|---|
| JP | 5-135654 A | 6/1993 |
| JP | 3284259 B2 | 3/2002 |

* cited by examiner

*Primary Examiner* — Jesus Hernandez
(74) *Attorney, Agent, or Firm* — Birch, Stewart, Kolasch & Birch, LLP

(57) ABSTRACT

An EL emitting touch switch includes first electrodes, a single second electrode facing the first electrodes, and EL layers each sandwiched between a corresponding one of the first electrodes and the second electrode. A light emission driver applies a driving voltage between the first and second electrodes to cause the EL layers to emit light. A timing signal generator generates a timing signal to control the light emission driver such that the application of the driving voltage is stopped at predetermined intervals. Touch decision units are provided for each first electrode. Each touch decision unit includes a feedback circuit for supplying current to the corresponding first electrode such that the potentials of the first and second electrodes become equal to each other, and detects contact of a human body with the corresponding first electrode based on operation of the feedback circuit while the application of the driving voltage is stopped.

3 Claims, 4 Drawing Sheets

EL EMITTING TOUCH SWITCH

BACKGROUND OF THE INVENTION

1. Field of the Invention

This invention relates to EL (electroluminescence) emitting touch switches utilizing EL in combination with a touch switch, and more particularly, to an EL emitting touch switch provided with a plurality of touch detection electrodes.

2. Description of the Related Art

Touch switches have been conventionally known which are provided with conductive electrodes for detecting the contact or proximity of part of a human body with or to the electrodes. In such touch switches, the electrode functions as a capacitance sensor, and the on/off operation of the touch switch is detected based on change in the impedance (electrostatic capacitance) of the electrode induced by the contact of a human body with the electrode.

There have also been known EL emitting touch switches in which the touch switch is combined with an organic or inorganic EL device for emitting light from a phosphor therein so that light may be emitted from the electrode upon detection of the contact of a human body with the electrode. This type of touch switch is disclosed, for example, in Unexamined Japanese Patent Publication No. H05-135654 (hereinafter referred to as Patent Document 1).

FIG. 3 is a schematic sectional view of an example of the body of the touch switch disclosed in Patent Document 1. As shown in FIG. 3, the body of the touch switch has a transparent, electrically insulating substrate 2, a transparent electrode 5 formed on a surface (upper surface) of the substrate 2, and a transparent insulating film 6 covering the upper surface of the electrode 5 and forming a touch surface.

Also, an EL layer 1 is formed on the reverse surface (lower surface) of the transparent insulating substrate 2. The EL layer 1 is formed by successively laminating, from the substrate side downward, a transparent electrode 1a, a phosphor layer 1b, an insulating layer 1c, and a back electrode 1d. When an alternating-current (AC) voltage is applied between the two electrodes 1a and 1d, the EL layer 1 emits light.

The emitted light propagates through the transparent electrode 1a, the transparent insulating substrate 2, the transparent touch detection electrode 5 and the transparent insulating film 6 to the outside of the touch switch, thus enabling the operator to easily locate the transparent insulating film 2 with the aid of the emitted light and touch the switch with his/her finger. When the transparent insulating film 6 is touched with the operator's finger, a touch decision circuit, not shown, connected to the transparent touch detection electrode 5 detects a change of the impedance or capacitance and judges that the transparent insulating film 6 is touched by the operator. Based on the judgment, the on-off control of a device connected to the touch decision circuit may be executed.

This touch switch essentially requires, however, a pair of electrodes 1a and 1d for driving the EL layer 1 to emit light, as well as the transparent touch detection electrode 5. It is therefore difficult to reduce the thickness of the touch switch, and also since the number of electrode layers is large, the cost increases.

As a solution to the problem, Japanese Patent No. 3284259 (hereinafter referred to as Patent Document 2) discloses an EL emitting touch switch in which the touch detection electrode and the EL driving electrode are unified into one common electrode, thereby making it possible to reduce the thickness of the touch switch.

FIG. 4 schematically shows the configuration of the EL emitting touch switch disclosed in Patent Document 2. As shown in FIG. 4, the switch body 10 of the touch switch includes an EL layer 1, which is a laminate having a phosphor layer 1b and an insulating layer 1c sandwiched between a transparent electrode (surface electrode) 1a and a back electrode 1d. The EL layer 1 is formed on an insulating substrate 3 and covered with a transparent insulating film 6. The transparent electrode 1a functions as both the touch detection electrode and the EL driving electrode.

Also, to the switch body 10 are connected a touch decision circuit 100 and an EL driver circuit 200 in parallel with each other. The touch decision circuit 100 detects change in potential of the transparent electrode 1a, to thereby detect the contact of part of the operator's body with the transparent insulating film 6. The EL driver circuit 200 outputs an AC voltage based on the potential of the transparent electrode 1a, to cause the EL layer 1 to emit light.

The switch body 10 is further provided with a drive control circuit 300, in addition to the touch decision circuit 100 and the EL driver circuit 200. The touch decision circuit 100 operates in accordance with a control signal from the drive control circuit 300. Also, the touch decision circuit 100 is so configured as to detect the contact of the operator's finger with the transparent insulating film 6 on the basis of change in the difference between the potential VA of the transparent electrode 1a and a ground potential VG. When the operator's touch on the transparent insulating film 6 is detected by the touch decision circuit 100, the drive control circuit 300 drives the EL driver circuit 200 to apply an AC electric field between the electrodes 1a and 1d, thereby controlling the emission of light from the EL layer 1.

It is conceivable that touch switches such as those described above are applied to a control panel for equipment (specifically, audio equipment or an air conditioner) installed in the passenger compartment of an automobile. With the technique disclosed in Patent Document 1, however, it is difficult to reduce the thickness of the touch switch, and accordingly, the disclosed touch switch is not suited for use in the control panel of, for example, audio equipment or air conditioner of an automobile. In the case of Patent Document 2, no problem arises if the touch detection electrode (transparent electrode 1a) used is one in number, but the disclosed technique fails to provide an effective solution in cases where a plurality of touch detection electrodes exist in the same panel, as in a control panel for an automobile device.

Specifically, in an EL panel with many independent light emitting regions (EL layer 1), the back electrode 1d generally has an area covering all light emitting regions so as to be used as a common electrode. However, where the EL panel is configured in the manner disclosed in Patent Document 2 such that the EL driver circuit is connected to the transparent electrode 1a and the back electrode 1d so as to operate based on the potential of the transparent electrode 1a serving also as the touch detection electrode, that is, the potential of the back electrode 1d is floating with respect to the ground potential, large electrostatic capacitance exists between the transparent electrode 1a, which constitutes an independent light emitting region, and the back electrode 1d. Consequently, when one of the multiple touch detection electrodes is touched by the operator, the touch is detected with respect to all switches at the same time (see FIG. 5).

SUMMARY OF THE INVENTION

An aspect of the present invention is directed to an EL emitting touch switch, comprising a plurality of first electrodes having light permeability; a second electrode arranged so as to face the plurality of first electrodes, the second electrode functioning as a single electrode associated with the plurality of first electrodes; a plurality of EL layers each sandwiched between a corresponding one of the first electrodes and the second electrode, each of the EL layers being a laminate including a phosphor layer and an electrically insulating layer; light emission driving means for applying a driving voltage between each of the first electrodes and the second electrode to cause the EL layers to emit light; timing signal generating means for generating a timing signal to control the light emission driving means such that the application of the driving voltage is stopped at predetermined intervals; and touch decision means provided for each of the first electrodes, each of the touch decision means including a feedback circuit that supplies an electric current to a corresponding one of the first electrodes such that potentials of the corresponding first electrode and the second electrode become equal to each other, and each of the touch decision means detecting contact of a human body with the corresponding first electrode based on operation of the feedback circuit while the application of the driving voltage by the light emission driving means is stopped in accordance with the timing signal.

BRIEF DESCRIPTION OF THE DRAWINGS

The present invention will become more fully understood from the detailed description given hereinafter and the accompanying drawings which are given by way of illustration only, and thus, are not limitative of the present invention, and wherein.

DETAILED DESCRIPTION OF THE INVENTION

An embodiment of the present invention will be hereinafter described with reference to the accompanying drawings.

Figure 1:
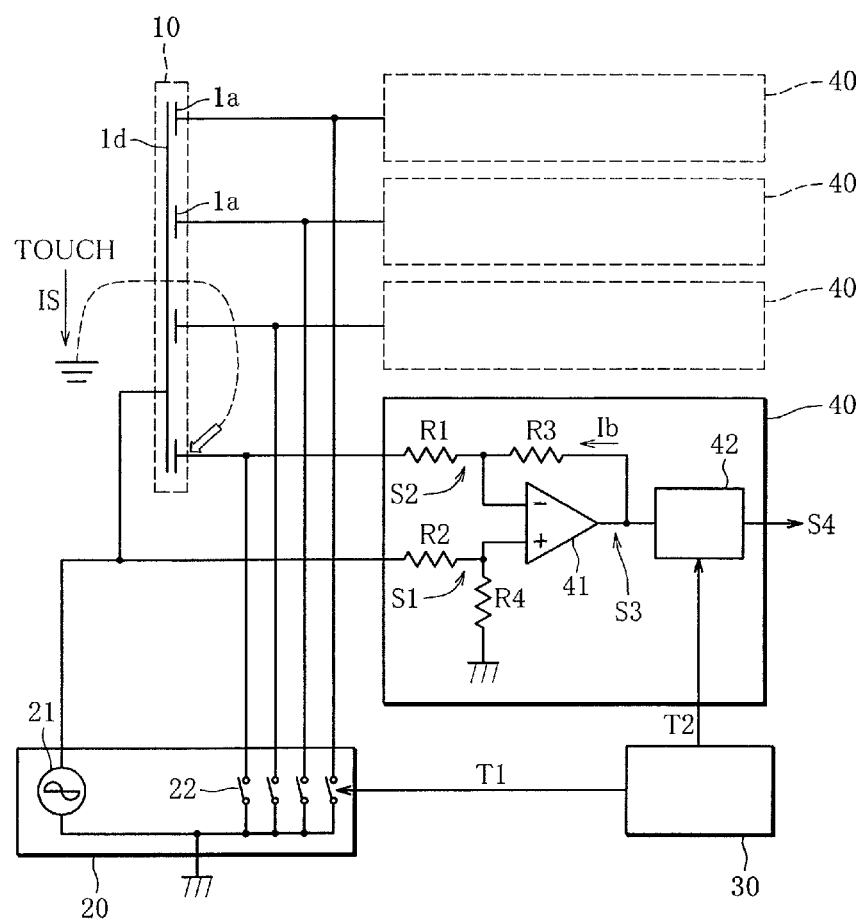
FIG. 1 shows the configuration of an EL emitting touch switch according to the present invention.

FIG. 1 illustrates the system configuration of an EL emitting touch switch according to the present invention.

As shown in FIG. 1, the EL emitting touch switch of the embodiment comprises a switch body 10, an EL driver (light emission driving means) 20, a timing signal generator (timing signal generating means) 30, and detectors (touch decision means) 40.

Figure 4:
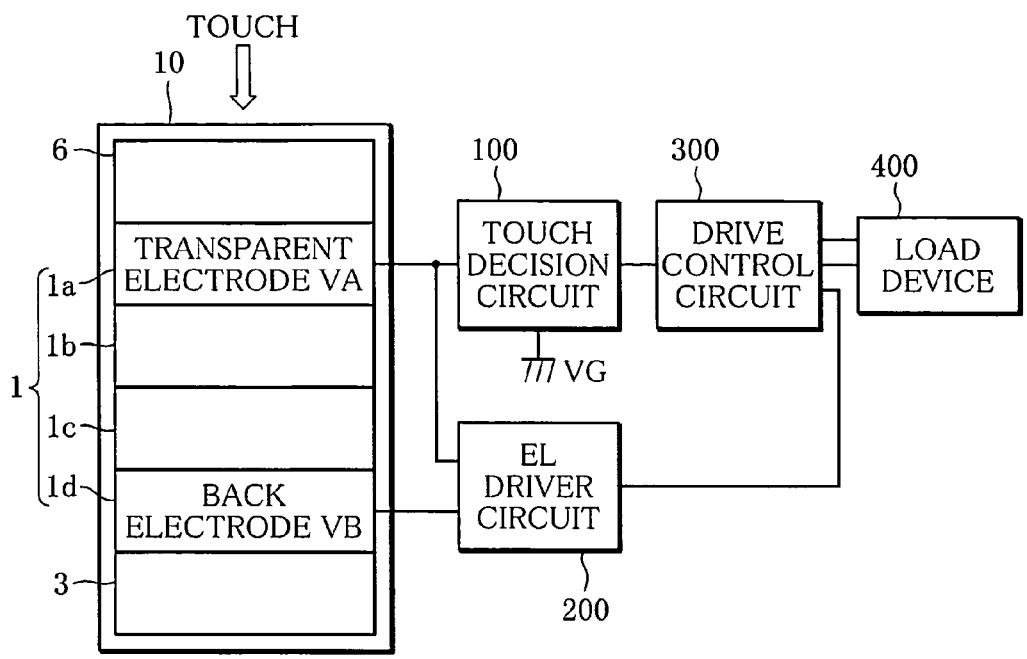
FIG. 4 shows the configuration of another conventional EL emitting touch switch.
Figure 5:
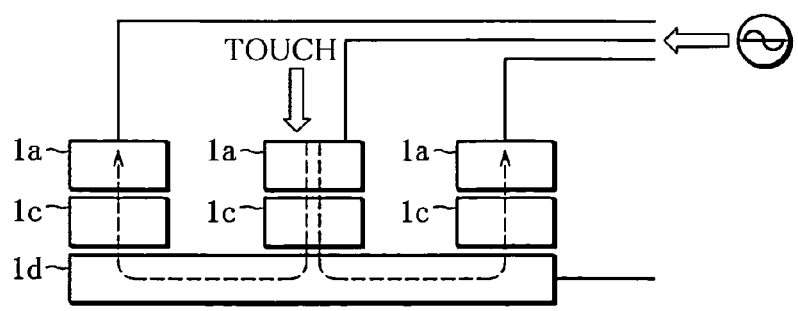
FIG. 5 illustrates a problem associated with the conventional switch.

Like the switch body 10 of the conventional touch switch shown in FIG. 4, the switch body 10 comprises an EL layer 1, which is a laminate obtained by sandwiching a phosphor layer 1b and an insulating layer 1c between a transparent surface electrode (first electrode) 1a and a back electrode (second electrode) 1d, and a transparent insulating film 6 formed over the EL layer 1. The surface electrode 1a serves as both a touch detection electrode and an EL driving electrode. More specifically, the switch body 10 of the embodiment is configured in the form of a panel provided with multiple touch detection electrodes. In other words, multiple surface electrodes 1a are associated with a single back electrode 1d. Thus, the EL layer 1 is formed with respect to each of the surface electrodes 1a.

The EL driver 20 includes an AC power supply 21 for outputting a 5-kHz sinusoidal wave voltage of 200 V, for example, and switching elements 22. The EL driver 20 has the function of applying a driving voltage between the back electrode 1d and each surface electrode 1a to cause the corresponding EL layer 1 to emit light.

Each switching element 22 is inserted in a circuit connecting the AC power supply 21 and the corresponding surface electrode 1a to open and close the circuit. In compliance with an external requirement (e.g., when the nighttime illumination switch, which is not shown, of an automobile is operated), the EL driver 20 turns on or off the switching element 22 connected to the surface electrode 1a associated with the corresponding EL layer. The on/off operation of each switching element 22 is also controlled by a timing signal T1 periodically supplied from the timing signal generator 30. Thus, even while the switching elements 22 are controlled to be turned on in accordance with external requirements, the elements 22 are periodically turned off in response to the timing signal T1.

The detector 40 is provided for each of the surface electrodes 1a and has the function of detecting the contact of part of a human body with the corresponding surface electrode 1a. Specifically, the detector 40 determines, based on an input signal (input voltage) S2 from the surface electrode 1a and an input signal (input voltage) S1 from the back electrode 1d, whether or not the corresponding surface electrode 1a is in contact with a human body. Each detector 40 comprises a differential amplifier circuit (feedback circuit) including resistors R1 to R4 and an operational amplifier 41, and a decision circuit 42. The resistance values of the resistors R1 to R4 are set so as to fulfill the relationships indicated by the following expressions (1) and (2):

$$R1=R2 \quad (1)$$

$$R3=R4 \quad (2)$$

While the switching element 22 is turned on and thus the corresponding EL layer is emitting light, the S2 input side is grounded and the voltage of the AC power supply 21 is applied only to the S1 input side because of the ON state of the switching element 22.

Figure 2:
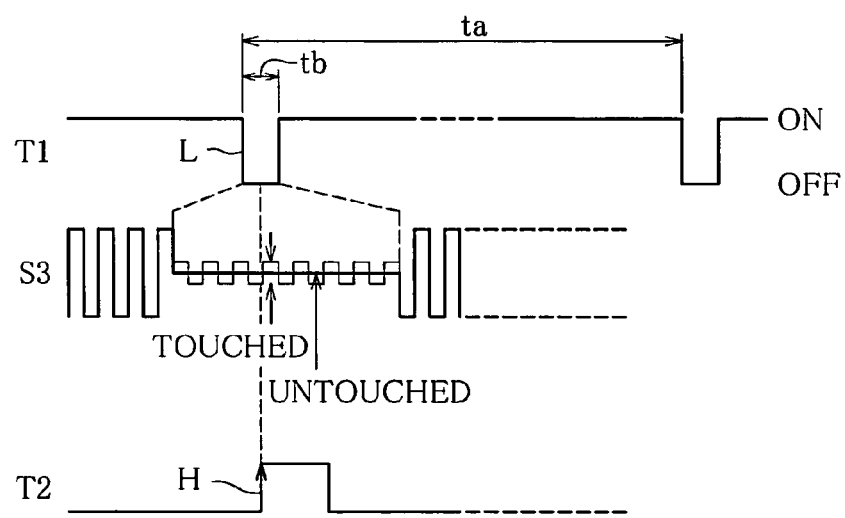
FIG. 2 is a time chart showing the transition of timing signals and the output signal of a differential amplifier circuit, used in the EL emitting touch switch according to the present invention.
Figure 3:
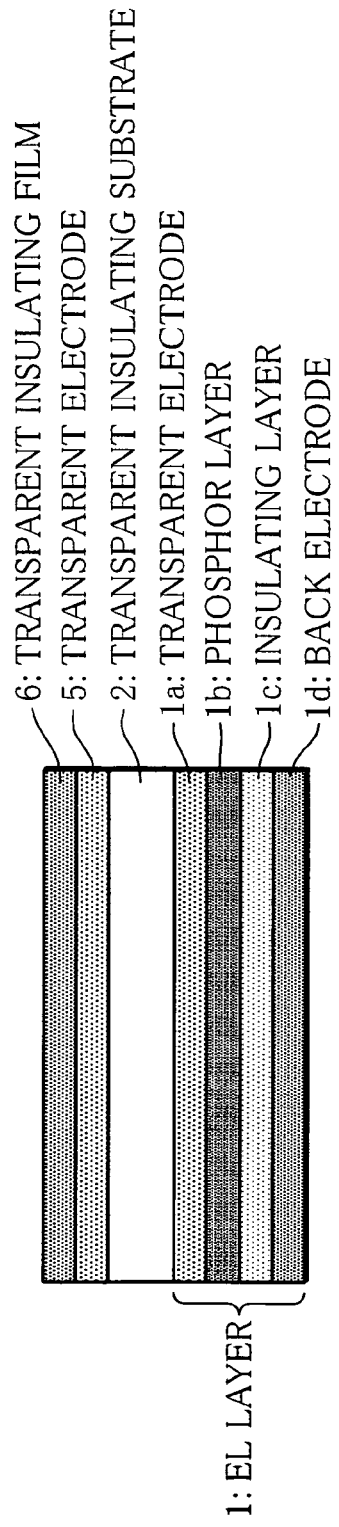
FIG. 3 is a sectional view of the switch body of a conventional EL emitting touch switch.

FIG. 2 is a time chart showing the transition of timing signals T1 and T2 and an output signal S3 of the differential amplifier circuit (output signal of the operational amplifier 41). During the application of the voltage from the AC power supply 21, the output signal (output voltage) S3 of the operational amplifier 41 has a large amplitude corresponding to the voltage of the AC power supply 21, as shown in FIG. 2, the amplitude value being given by the following expression (3):

$$S3=(S2-S1)R3/R1 \quad (3)$$

The timing signal generator 30 outputs, as the timing signal T1, an L signal (OFF signal) which appears at intervals of ta and lasts for a period tb. Each switching element 22 is configured so as to be turned off (opened) when supplied with the L signal (OFF signal) from the timing signal generator 30. Preferably, the interval ta and OFF period tb of the timing signal T1 are set to about 50 msec and 2 msec, respectively, but the interval ta and the OFF period tb to be set are not limited to these values and may be set as needed on condition that the relationship tb<ta is fulfilled. The timing signal generator 30 also outputs, as the timing signal T2, an H signal shorter than the OFF period tb to the decision circuit 42. The generation timing (OFF-to-ON transition) of the H signal is set so as to take place while the L signal is being output.

While the L signal is output (during the OFF period), the back electrode 1*d* and the surface electrode 1*a* of the switch body 10 are coupled with large electrostatic capacitance, and accordingly, both the voltage of the back electrode 1*d* and the voltage of the surface electrode 1*a* become equal to the voltage of the AC power supply 21. The voltage of the output signal S3 of the differential amplifier circuit is therefore 0 V while the switching element 22 is turned off.

In FIG. 2, the period for which the output signal S3 remains at 0 V is equal to the period tb for which the timing signal T1 remains low (L signal) but is shown enlarged for the sake of visibility, as indicated by broken lines in the figure. The timing signal T2 is also shown on the same time scale as the output signal S3.

When the operator touches the surface electrode 1*a*, a ground current IS flows through the operator. Accordingly, the potential of the surface electrode 1*a* tends to lower, developing a potential difference between the input signals S1 and S2. However, the operational amplifier 41 outputs, through the resistor R3, a feedback current Ib compensating for the potential difference (an imaginary short state of the operational amplifier), with the result that the potential difference between the signals S1 and S2, in other words, between the back and surface electrodes 1*d* and 1*a* is canceled out. At this time, therefore, the voltage of the output signal S3, which is the voltage generated by the operational amplifier 41 to output the feedback current through the resistor R3, is proportional to the ground current IS flowing through the operator.

Since the detector 40 operates in the aforementioned manner, the output signal S3 shows different amplitudes during the OFF period of the switching element 22 depending on whether the surface electrode 1*a* is touched by the operator or not, as indicated by the solid and broken lines in FIG. 2. Based on the change in the amplitude, the decision circuit 42 detects the operator's touch.

The decision circuit 42 includes a detector circuit, not shown, for converting the amplitude of the output signal S3 to direct current (DC) voltage, and compares the DC voltage with a predetermined threshold at the rise timing of the timing signal T2 supplied from the timing signal generator 30. Then, the decision circuit 42 outputs the result of the comparison from a terminal S4, the output being used to control the operation of the corresponding automobile device connected to the detector 40.

According to the embodiment configured as described above, while the L signal is being output, the potentials of the signals S1 and S2 are kept equal by the feedback current Ib. In addition, since the resistors fulfill the relationships R1=R2 and R3=R4, the potentials of the back and surface electrodes 1*d* and 1*a* also are eventually made equal to each other. Consequently, no electric current flows between the back and surface electrodes 1*d* and 1*a*, no matter what value the electrostatic capacitance or impedance present between the electrodes 1*d* and 1*a* may be, and thus, the value of the electrostatic capacitance or impedance has nothing to do with the magnitude of the output signal S3 that varies when the operator touches the surface electrode 1*a*. That is to say, the value of the electrostatic capacitance or impedance does not affect the sensitivity of the detector for detecting the operator's touch, and moreover, the mutual influence of adjacent surface electrodes 1*a* of the switch body 10 attributable to the electrostatic capacitance or the impedance can be eliminated.

As described above, the EL emitting touch switch of the embodiment includes the multiple surface electrodes 1*a*, each functioning as both the touch detection electrode and the EL driving electrode, and the single (common) back electrode 1*d*. This configuration makes it possible to eliminate the mutual influence of the surface electrodes caused due to the electrostatic capacitance or impedance present between each of the surface electrodes 1*a* and the back electrode 1*d*, and also permits accurate detection of the operator's touch on the individual surface electrode 1*a*.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An EL emitting touch switch, comprising:
    a plurality of first electrodes having light permeability;
    a second electrode arranged so as to face the plurality of first electrodes, the second electrode functioning as a single electrode associated with the plurality of first electrodes;
    a plurality of EL layers each sandwiched between a corresponding one of the first electrodes and the second electrode, each of the EL layers being a laminate including a phosphor layer and an electrically insulating layer;
    light emission driving means for applying a driving voltage between each of the first electrodes and the second electrode to cause the EL layers to emit light, the light emission driving means including switching elements that selectively and electrically connect each of the plurality of first electrodes to a ground potential and disconnect the first electrodes from the ground potential;
    timing signal generating means for generating a first timing signal to control the light emission driving means such that the application of the driving voltage is stopped at predetermined intervals by electrically disconnecting the first electrodes from the ground potential by the switching elements while the first timing signal is being output, the first timing signal being a pulse signal having a first predetermined width; and
    touch decision means provided for each of the first electrodes, each of the touch decision means including a feedback circuit that supplies an electric current to a corresponding one of the first electrodes such that potentials of the corresponding first electrode and the second electrode become equal to each other when the first timing signal is being output, and a decision circuit that detects contact of a human body with the corresponding first electrode based on operation of the feedback circuit only while the application of the driving voltage by the light emission driving means is being stopped in accordance with the first timing signal,
    wherein the timing signal generating means generates a second timing signal while the first timing signal is being output, the second timing signal being a pulse signal having a second predetermined width shorter than the first predetermined width such that the second timing signal completely overlaps the first timing signal, and
    the decision circuit detects contact of a human body at a rise timing of the second timing signal from the timing signal generating means.

2. The EL emitting touch switch according to claim 1, wherein said feedback circuit is a differential amplifier circuit including an operational amplifier and resistors; and
    each of said touch decision means detects the contact of a human body with the corresponding first electrode based on an output voltage of the operational amplifier.

3. An EL emitting touch switch, comprising:

a plurality of first electrodes having light permeability;

a second electrode arranged so as to face the plurality of first electrodes, the second electrode functioning as a single electrode associated with the plurality of first electrodes;

a plurality of EL layers each sandwiched between a corresponding one of the first electrodes and the second electrode, each of the EL layers being a laminate including a phosphor layer and an electrically insulating layer;

light emission driving means for applying a driving voltage between each of the first electrodes and the second electrode to cause the EL layers to emit light, the light emission driving means including switching elements that selectively and electrically connect each of the plurality of first electrodes to a ground potential and disconnect the first electrodes from the ground potential;

timing signal generating means for generating a first timing signal to control the light emission driving means such that the application of the driving voltage is stopped at predetermined intervals by electrically disconnecting the first electrodes from the ground potential by the switching elements while the timing signal is being output, the first timing signal being a pulse signal having a first predetermined width, and a second timing signal while the first timing signal is being output, the second timing signal being a pulse signal having a second predetermined width shorter than the first predetermined width such that the second timing signal completely overlaps the first timing signal; and touch decision means provided for each of the first electrodes, each of the touch decision means including a feedback circuit that supplies an electric current to a corresponding one of the first electrodes such that potentials of the corresponding first electrode and the second electrode become equal to each other when the first timing signal is being output, and each of the touch decision means detecting contact of a human body with the corresponding first electrode based on operation of the feedback circuit only while the application of the driving voltage by the light emission driving means is being stopped in accordance with the timing signal and at a rise timing of the second timing signal, wherein said feedback circuit is a differential amplifier circuit including an operational amplifier and resistors, and each of said touch decision means detects the contact of a human body with the corresponding first electrode based on an output voltage of the operational amplifier, wherein the resistors includes, a first resistor connected between the first electrode and a first input terminal of the operational amplifier, a second resistor that has a resistance same as a resistance of the first resistor, and connected between the second electrode and a second input terminal of the operational amplifier, a third resistor connected between the first input terminal and an output terminal of the operational amplifier, and a fourth resistor that has a resistance same as a resistance of the third resistor, and connected between the second input terminal of the operational amplifier and a ground potential.

* * * * *